United States Patent
Sanemitsu

Patent Number: 5,384,748
Date of Patent: Jan. 24, 1995

[54] MEMORY CARD WITH TWO SRAM ARRAYS WITH DIFFERENT DATA HOLDING VOLTAGES AND POWER BACK-UP

[75] Inventor: Yoshikado Sanemitsu, Itami, Japan

[73] Assignee: Mitsubishi Denki Kabushiki Kaisha, Tokyo, Japan

[21] Appl. No.: 130,876

[22] Filed: Oct. 4, 1993

[30] Foreign Application Priority Data

Oct. 7, 1992 [JP] Japan .................. 4-268953

[51] Int. Cl.6 .................. G11C 11/412; G11C 11/417
[52] U.S. Cl. .................. 365/229; 365/154; 365/156; 365/228; 365/230.03
[58] Field of Search .................. 365/230.03, 228, 229, 365/154, 156

[56] References Cited

U.S. PATENT DOCUMENTS

| 4,763,333 | 8/1988 | Byrd | 365/228 |
| 4,800,533 | 1/1989 | Arakawa | 365/228 |
| 5,047,979 | 9/1991 | Leung | 365/154 |
| 5,243,577 | 9/1993 | Ueda et al. | 365/229 |
| 5,274,827 | 12/1993 | Haggerty et al. | 365/228 |

FOREIGN PATENT DOCUMENTS

| 59-117776 | 7/1984 | Japan | 365/229 |
| 60-31665 | 2/1985 | Japan | 365/228 |
| 60-140412 | 7/1985 | Japan | 365/229 |
| 2-118992 | 5/1990 | Japan | 365/229 |

*Primary Examiner*—Joseph E. Clawson, Jr.
*Attorney, Agent, or Firm*—Leydig, Voit & Mayer

[57] ABSTRACT

In a memory card according to the present invention, a full CMOS type volatile memory element is employed as a memory for storing attribute data. The full CMOS type volatile memory element has a low data holding voltage, consumes less power, has a short data writing time, and is less expensive than a programmable non-volatile memory element. Further, an internal power source line is provided for the volatile memory element separately from an internal power source line for a volatile memory element for storing data, and a capacitor having a large capacity or a secondary cell is connected to the internal power source line to further increase the data holding time. The volatile memory element for storing attribute data may be combined with a control circuit. Consequently, the production cost of the memory card for storing attribute data and the attribute data writing time can be reduced. Further, since the memory element is combined with the control circuit, the space of the memory card can be effectively utilized.

10 Claims, 3 Drawing Sheets

MEMORY CARD WITH TWO SRAM ARRAYS WITH DIFFERENT DATA HOLDING VOLTAGES AND POWER BACK-UP

BACKGROUND OF THE INVENTION

1. Field of the Invention

The present invention relates to a memory card which stores attribute data associated with itself, and more particularly and, to the internal structure of that memory card.

2. Description of the Related Art

FIG. 6 is a block diagram of the internal structure of a conventional memory card of the above-described type.

Reference numeral 1 denotes a control circuit; reference numeral 2 denotes a volatile memory element, such as an SRAM (static random access memory), for storing data. Reference numeral 3 denotes a nonvolatile memory element, such as an EEPROM (electrically erasable programmable read only memory), for storing attribute data. Reference numerals 4 and 5 denote diodes for preventing reverse flow of a current. Reference numeral 8 denotes a primary cell for supplying power to back up the memory element. Reference numerals 9 and 21 denote bypass capacitors. Reference numerals 11 and 12 denote pull-up resistors. Reference numeral 13 denotes a card enable signal line ($\overline{CE}$). Reference numeral 14 denotes a memory selection signal line ($\overline{REG}$). Reference numeral 15 denotes a readout control signal line ($\overline{OE}$). Reference numeral 16 denotes a write control signal line ($\overline{WE}$). Reference numeral 17 denotes an address signal line (An). Reference numeral 18 denotes a data signal line (Dm). Reference numeral 19 denotes a power line (Vcc). Reference numeral 20 denotes a grounded line (GND). Reference numeral 22 denotes an internal power line. An address signal (An) and a data signal (Dm) may generally be n-bit and m-bit parallel signals, respectively. The address signal line (An) 17 and the data signal line (Dm) 18 form an address bus and a data bus, respectively. A power source 50, indicated by a circle in the figure, indicates a potential of a power source line 19 which is not backed up with a battery-power supply. A power source 51, indicated by a square, indicates a potential of the internal power source line 22 which is backed up by the primary cell 8.

The operation of the memory card arranged in the manner described above will now be described. The basic read and write operations of the above-described type of memory card are disclosed in, for example, "IC Memory Card Guideline" (by Japanese Electronic Industry Development Association), and detailed description thereof will be omitted. The circuit employed in this memory card is a negative logic (low active) circuit. The operation of the memory card requires application of a voltage between the power source line and the grounded line 20 and supply of a data signal, an address signal and various control signals to the memory card. When the memory card is connected to an external device (not shown), a voltage is applied between the power source line 19 and the grounded line 20 from the external device, and the data signal, the address signal and various control signals are input to the memory card to operate the memory card. When the card enable signal line 13 goes low under conditions that the memory card is connected to the external device and that a voltage is thereby applied to the memory card, the memory card enters the operable state. When the readout control line 15 goes low and the write control line goes high, the data stored in either of the memory elements 2 and 3 at an address corresponding to the address signal (An) on the address signal line 18 shows up on the data signal line 18. Conversely, when the readout control line 15 goes high and the write control line 16 goes low, the data (Dm) on the data signal line 18 can be written into either of the memory cards 2 and 3 at an address corresponding to the address signal (An) on the address signal line 17. The memory element to which readout or write is performed is selected by a memory selection signal ($\overline{REG}$) on the memory selection signal line 14. If the memory selection signal ($\overline{REG}$) is, for example, high, the memory element 2 is selected. If the memory selection signal is low, the memory element 3 is selected. More specifically, if the memory selection signal ($\overline{REG}$) is high, the control circuit 1 supplies a low-level signal to the memory element 2 to set it in the operable state. If the memory selection signal ($\overline{REG}$) is low, the control circuit 1 supplies a low-level signal to the memory element 3 to set it in the operable state. The memory selection signal ($\overline{REG}$) may be the most significant bit of the address signal.

When the card enable signal line 13 goes high, both of the memory elements 2 and 3 enter the non-operating state. Consequently, power consumption is very low, and the data signal line 18 enters a high impedance state.

When no voltage is applied between the power source line 19 and the grounded line 20, e.g., when the card is not connected to the external device, a voltage is supplied from the primary cell 8 to the memory element 2 through the diode 4 to hold the data in the memory element 2. At that time, since the card enable signal line 13 is connected, through the pull-up resistor 11, to the power source 51 which is backed up by the primary cell 8, it goes high, setting both the memory elements 2 and 3 in the non-operating state.

Normally, the volatile memory element 2 is used as a data area for storing data, and the non-volatile memory element 3 is used as an attribute data area for storing the attribute data on the card. The attribute data includes physical data, such as the memory capacity of the memory card and the access time thereof, and is preferably stored in the non-volatile memory element. Normal data requires high-speed read out and write, and is preferably stored in the volatile memory element.

A non-volatile memory used in the conventional memory card arranged in the manner described above as the non-volatile memory element for storing attribute data, such as an EEPROM which can be reprogrammed after erasing data stored in it, generally requires a long writing time and is expensive.

SUMMARY OF THE INVENTION

Accordingly, an object of the present invention is to provide a memory card which enables the writing time of a memory element for storing attribute data to be reduced, and which enables production cost of the memory card to be reduced.

To achieve the above object, according to one aspect of the present invention, there is provided a memory card in which a second volatile memory means for storing attribute data comprises a volatile memory backed up by a primary cell and in which that volatile memory comprises a full CMOS type memory element. Consequently, the minimum data holding voltage of the second volatile memory means is lower than that of a first volatile memory means for storing data.

According to another aspect of the present invention, there is provided a memory card in which first and second internal power source lines are provided for the first volatile memory means for storing data and the second volatile memory means for storing attribute data, respectively. The first and second internal power source lines are each backed up by a primary cell and electrically separated. An auxiliary back up means, comprising at least either a capacitor having a large capacity or a secondary cell, is provided on the second internal power source line connected to the second volatile memory means in order to further increase the data holding time of the second volatile memory means.

According to still another aspect of the present invention, there is provided a memory card in which a second volatile memory means for storing attribute data, comprising a full CMOS type memory element, is combined with a control means for selectively setting the first and second volatile memory means in an operable state to form a hybrid control means.

In the memory card provided according to one aspect of the present invention, since the volatile memory element (the second volatile memory means) is used as the memory element for storing attribute data, the attribute data writing time can be reduced. Further, since that volatile memory element comprises a full CMOS type memory element whose minimum data holding time is low, the attribute data can be held at a lower voltage than that at which data is held.

In the memory card provided according to another aspect of the present invention, the attribute data can be held for a longer period of time than that of the above-described memory card by an electric charge stored in a large-capacity capacitor or a secondary cell connected to an internal power source line for the second volatile memory means for storing attribute data.

In the memory card provided according to still another aspect of the present invention, since the second volatile memory means for storing attribute data is combined with a control means for selectively setting the memory means in an operable state, the space required for the memory means in the memory card can be reduced, and the space of the memory card can be effectively utilized.

DESCRIPTION OF THE PREFERRED EMBODIMENTS

Embodiments of the present invention will be described below with reference to the accompanying drawings.

First Embodiment

Figure 1:
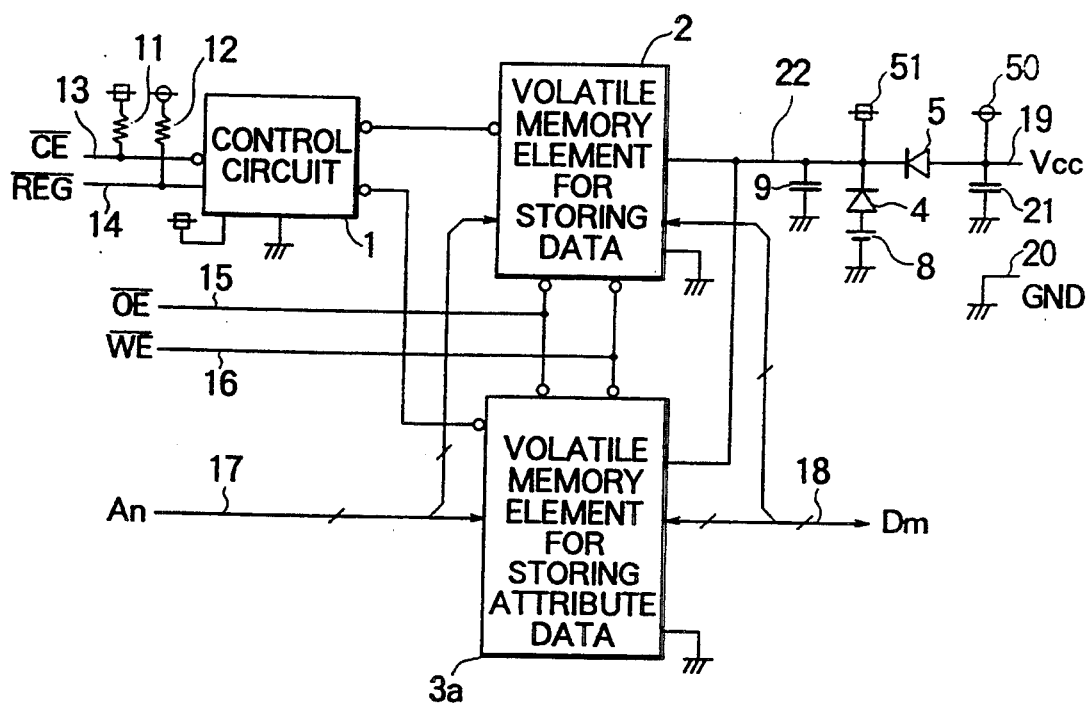
FIG. 1 is a block diagram of a first embodiment of a memory card according to the present invention.

FIG. 1 is a block diagram of a first embodiment of a memory card according to the present invention, showing the internal structure thereof.

Reference numeral 1 denotes a control circuit. Reference numeral 2 denotes a volatile memory element for storing data, such as a SRAM. Reference numeral 3a denotes a volatile memory element for storing attribute data, such as a SRAM. Reference numerals 4 and 5 denote diodes for preventing reverse flow of a current. Reference numeral 8 denotes a primary cell which backs up a memory element. Reference numeral 9 and 21 denote bypass capacitors for stabilizing a voltage. Reference numerals 11 and 12 denote pull-up resistors. Reference numeral 13 denotes a card enable signal line ($\overline{CE}$). Reference numeral 14 denotes a memory selection signal line ($\overline{REG}$). Reference numeral 15 denotes a readout control signal line ($\overline{OE}$). Reference numeral 16 denotes a write control signal line ($\overline{WE}$). Reference numeral 17 denotes an address signal line (An). Reference numeral 18 denotes a data signal line (Dm). Reference numeral 19 denotes a power source line (Vcc). Reference numeral 20 denotes a grounded line (GND). Reference numeral 22 denotes an internal power source line. An address signal (An) and a data signal (Dm) may generally be n-bit and m-bit parallel signals, respectively. The address signal line (An) 17 and the data signal line (Dm) 18 form an address bus and a data bus, respectively. A power source 50, indicated by a circle in the figure, indicates a potential of a power source line 19 which is not backed up with a battery-power supply. A power source 51, indicated by a square, indicates a potential of the internal power source line 22 which is backed up by the primary cell 8.

In the memory card shown in FIG. 1 the volatile memory element 3a is used as the memory element for storing attribute data. The volatile memory element 3a is backed up by the primary cell 8 through the internal power source line 22. Further, the volatile memory element 3a for storing the attribute data (actually, it may also store other data) is made up of different type of memory cells from those employed in the volatile memory element 2 for storing data in order to reduce the minimum data holding voltage thereof as compared to that of the memory element 2.

The volatile memory element 2 is part of a first volatile memory means. The volatile memory element 3 is part of a second volatile memory means. The card enable signal line 13, the memory selection signal line 14, the readout control signal line 15, the write control signal line 16, the address signal line 17 and the data signal line 18 are part of a signal transmission means. The control circuit 1 is part of a control means.

Figure 2A:
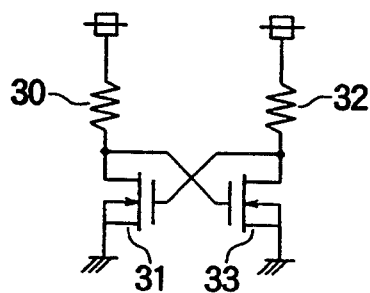
FIG. 2A is a circuit diagram of a single memory cell of the volatile memory element for storing data shown in FIG. 1.
Figure 2B:
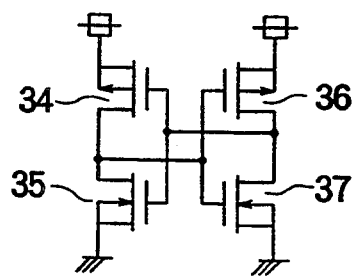
FIG. 2B is a circuit diagram of a single memory cell of the volatile memory element for storing attribute data shown in FIG. 1.

FIG. 2A is a circuit diagram of one of the memory cells of the volatile memory elements 2. FIG. 2B is a circuit diagram of one of the memory cells of the volatile memory element 3a. The memory cell of the volatile memory element 2, shown in FIG. 2A, is made up of N-channel MOS transistors 31 and 33 and resistor elements 30 and 32. The memory cell of the volatile memory element 3a, shown in FIG. 2A, is a full CMOS type memory cell made up of N-channel MOS transistors 35 and 37 and P-channel MOS transistors 34 and 36.

The data readout and write operations for the above-described card are basically the same as those for the conventional memory card. However, since the volatile memory element is used as the memory element 3a for storing attribute data, the writing time can be reduced. Further, the memory element 3a for storing attribute data is backed up by the primary cell 8 through the diode 4, the data stored in the memory element 3a is lost when the power supplied from the primary cell falls to the minimum memory data holding voltage.

The minimum data holding voltage for a memory is mostly determined by the circuit configuration of a memory cell thereof. In the case of the memory cell of the volatile memory element 2 shown in FIG. 2A, when the voltages on the N-channel MOS transistors 31 and 33 are imbalanced due to a voltage drop occurring in the resistor 30 or 32, the memory cell becomes unstable and loses data. In recently developed memory elements, the resistance of each of the resistors is set to a very high value (on the order of tera ohms) due to the need for reducing the current flowing there-through as much as possible, thereby increasing the effective value of the minimum data holding voltage of the memory element.

In the case of the memory cell of the volatile memory element 3a shown in FIG. 2B, the resistances of the P-channel MOS transistors 34 and 36, which replace the resistances shown in FIG. 2A, are sufficiently low, and the minimum data holding voltage is hence lower than that of the memory cell shown in FIG. 2A. Also, the power consumption is low.

Consequently, as the primary cell 8 is consumed, the data stored in the memory element 2 made up of the memory cells shown in FIG. 2A is first lost, which is followed by the destruction of the attribute data stored in the memory element 3a made up of the memory cells shown in FIG. 2B.

Although it is not necessary to permanently hold the attribute data stored in the memory element 3a, the data stored in the memory element 3a is necessary for the subsequent storage of data in the memory element 2. In other words, in a situation where the primary cell 8 has been pulled out and the data in the memory elements 2 and 3a are temporarily being held by the electric charge stored in the capacitor 9, the data stored in the memory element 3a is held for a longer period of time than the data in the memory element 2 due to its lower minimum data holding voltage.

It is difficult to increase the complexity of the memory element made up of the full CMOS type memory cells shown in FIG. 2B, and that memory element is thus inappropriate as the memory element for storing data.

Second Embodiment

Figure 3:
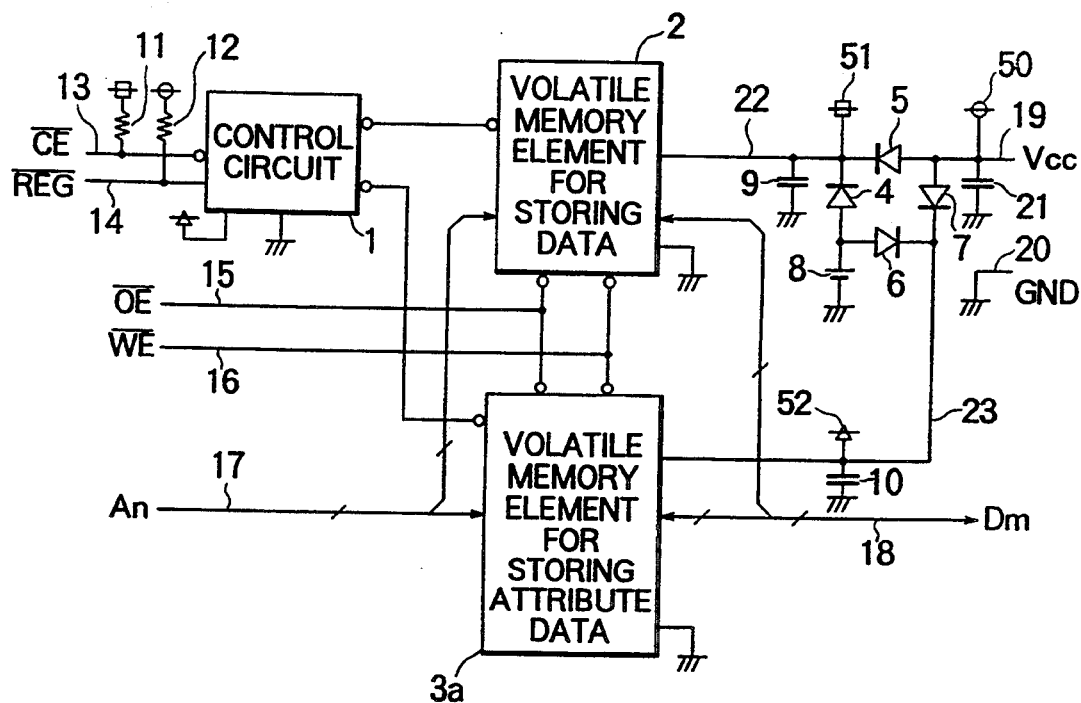
FIG. 3 is a block diagram of a second embodiment of the memory card according to the present invention.

FIG. 3 is a block diagram of a second embodiment of the memory card according to the present invention. In the above-described embodiment, the internal power source line 22 is common to both the memory elements 2 and 3a. However, in this embodiment, a first internal power source line 22 is provided for the memory element 2, while a second internal power source line 23 is provided for the memory element 3a. At the same time, a capacitor 10 having a capacity larger than that of the bypass capacitor 9 for stabilizing the voltage of the internal power source line connected to the first internal power source line 22 is connected to the second internal power source line 23 of the memory element 3a. Since the first and second internal power source lines 22 and 23 for the memory elements 2 and 3a have different potentials due to the action of the diodes 4, 5, 6 and 7, the second internal power source line 23 is backed up by both the primary cell 8 and the capacitor 10 which is the auxiliary backing up means. Consequently, for example, immediately after the primary cell 8 has been temporarily removed for replacement thereof, the memory element 3a for storing the attribute data can hold the data for a longer period of time than the memory element 2 due to the electric charge stored in the capacitor 10. The power source 52, indicated by a triangle in FIG. 3, indicates the potential of the second internal power source line 23 backed up by both the primary cell 8 and the capacitor 10 of the auxiliary backing up means.

Third Embodiment

Figure 4:
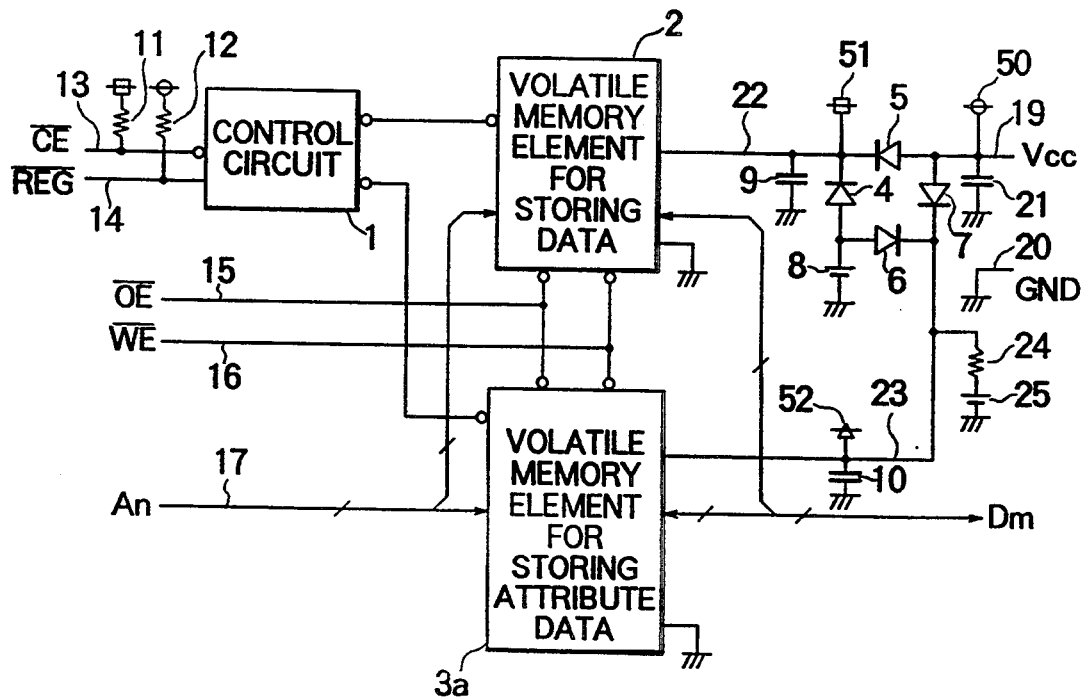
FIG. 4 is a block diagram of a third embodiment of the memory card according to the present invention.

FIG. 4 is a block diagram of a third embodiment of the memory card according to the present invention. This embodiment differs from the second embodiment in that a secondary cell 25 is connected to the second internal power source line 23 through a resistor 24 for backing up the memory element. Thus, after the primary cell 8 is removed, the attribute data stored in the memory element 3a can be held for a longer period of time than that of the second embodiment. A rechargeable cell, such as a nickel-cadmium battery, may be used as the secondary cell 25, serving as an auxiliary backing up means. The provision of the secondary cell 25 assures a predetermined effect even when the capacity of the capacitor 10 is not large. Hence, in the second and third embodiments, at least either the capacitor 10 having a large capacity or the secondary cell 25 may be provided to obtain a predetermined effect.

Fourth Embodiment

Figure 5:
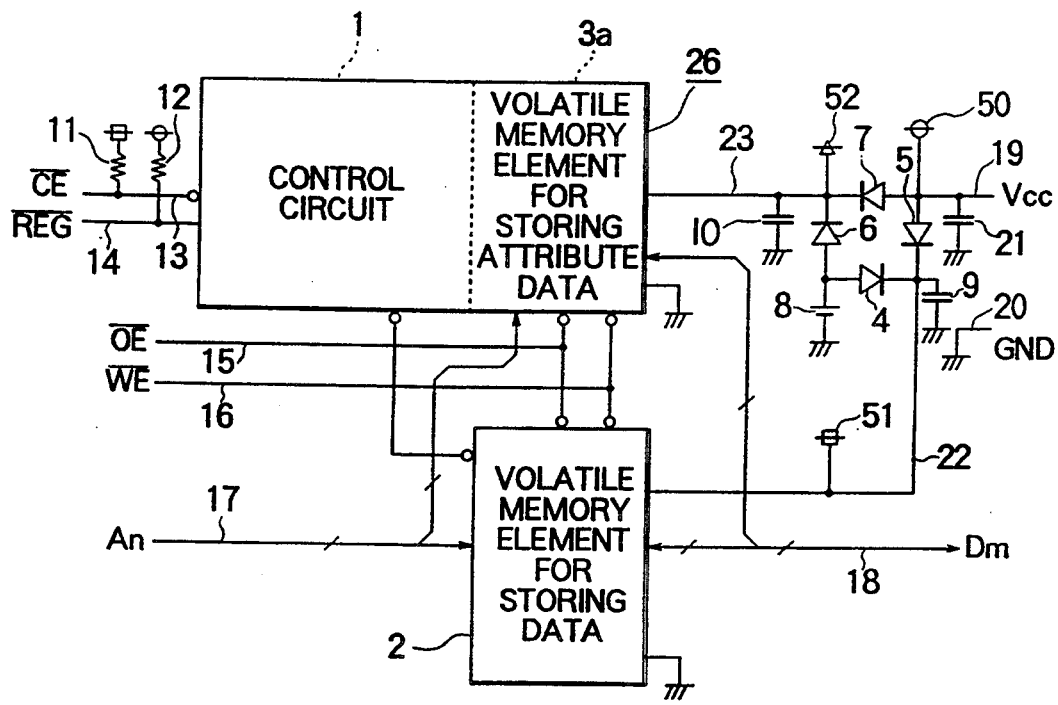
FIG. 5 is a block diagram of a fourth embodiment of the memory card according to the present invention.
Figure 6:
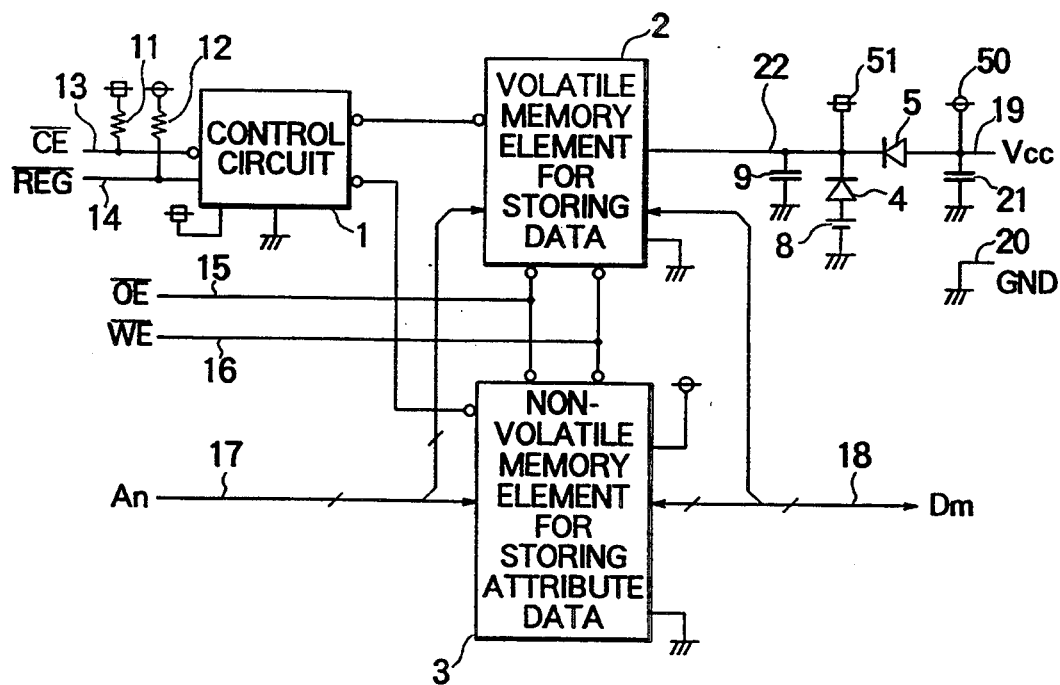
FIG. 6 is a block diagram of a conventional memory card.

FIG. 5 is a block diagram of a fourth embodiment of the memory card according to the present invention. In this embodiment, the full CMOS type memory element employs no resistor, and thus matches well with another peripheral circuits, i.e., enables an increase in complexity. Thus, in this embodiment, the control circuit 1, for example, an address decoder or the like, is combined with the volatile memory 3a for storing attribute data to form a hybrid control circuit 26. Consequently, the space required for the memory card can be reduced. Also, the space can be effectively used, and reliability of the card can be improved. Although FIG. 5 illustrates a memory card in which the first and second internal power source lines 22 and 23 are respectively provided for the memory elements 2 and 3a as the power source circuits thereof, an internal power source line which is common to both the memory elements 2 and 3a may be provided, as in the case of the embodiment shown in FIG. 1.

As will be understood from the foregoing description, the memory card provided according to one aspect of the present invention employs the volatile memory element (the second volatile memory means) as the memory element for storing attribute data, so that the attribute data writing time can be reduced. Further, that volatile memory element comprises a full CMOS type memory element whose minimum data holding voltage is low and consumes less power. As a result, attribute data can be held at a voltage lower than that for general data. This assures effective holding of data when the back up power is cut off for a short period of time, such as when an electric cell is replaced with a new one.

In the memory card provided according to another aspect of the present invention, the internal power source lines are separately provided for the volatile memory element for storing data (the first volatile memory means) and the volatile memory element for storing attribute data (the second volatile memory means), and at least either a capacitor having a large capacity or a secondary cell for backing up the memory card is connected to the internal power source line for the memory element for storing attribute data. Consequently, the attribute data holding time can further be increased by the electric charge stored in the capacitor and/or the secondary cell.

In the memory card provided according to still another aspect of the present invention, the memory element for storing attribute data is combined with the control circuit for selectively setting the memory elements in an operable state. Consequently, the space required for the memory card can be reduced. Also, the space can be effectively used, and reliability of the card can be improved.

What is claimed is:

1. A memory card comprising:
   first volatile memory means for storing data and having a minimum data holding voltage;
   second volatile memory means for storing at least attribute data concerning attributes of said memory card, said second volatile memory means including memory cells having a minimum data holding voltage lower than the minimum data holding voltage of said first volatile memory means;
   signal transmission means for transmitting data signals, address signals, and control signals between said first and second volatile memory means and an external device;
   control means connected to said signal transmission means for selectively setting said first and second volatile memory means in an operable state in response to a signal from the external device;
   an internal power source line for supplying power from the external device to said first and second volatile memory means; and
   a primary cell connected to said internal power source line for supplying a data holding voltage to said first and second volatile memory means to back up said first and second memory means when no power is supplied from said external device.

2. The memory card according to claim 1 wherein said second volatile memory means comprises full CMOS memory cells.

3. The memory card according to claim 2 wherein said internal power source line includes separate first and second internal power source lines for supplying power from the external device to said first and second volatile memory means, respectively, said primary cell backing up said memory card being connected to both of said first and second internal power source lines, and said memory card comprises auxiliary back up means connected to said second internal power source line for extending data holding time of said second volatile memory means.

4. The memory card according to claim 3 wherein said auxiliary back up means comprises a capacitor having a large capacity.

5. The memory card according to claim 2 wherein each full CMOS memory cell includes four CMOS transistors.

6. The memory card according to claim 3 wherein said auxiliary back up means comprises a secondary cell.

7. A memory card comprising:
   first volatile memory means for storing data and having a minimum data holding voltage;
   signal transmission means for transmitting data signals, address signals, and control signals between said first volatile memory means and an external device;
   control means including second volatile memory means for storing at least attribute data concerning attributes of said memory card and connected to said signal transmission means for selectively setting said first and second volatile memory means in an operable state in response to a signal from the external device, said second volatile memory means including full CMOS memory cells having a minimum data holding voltage lower than the minimum data holding voltage of said first volatile memory means, said signal transmission means transmitting data signals, address signals, and control signals between said second volatile memory means and the external device;
   an internal power source line for supplying power from the external device to said first and second volatile memory means; and
   a primary cell connected to said internal power source line for supplying a data holding voltage to said first and second volatile memory means to back up said first and second memory means when no power is supplied from said external device.

8. A memory card comprising:
   first volatile memory means for storing data and having a minimum data holding voltage;
   signal transmission means for transmitting data signals, address signals, and control signals between said first volatile memory means and an external device;
   control means including second volatile memory means for storing at least attribute data concerning attributes of said memory card and connected to said signal transmission means for selectively setting said first and second volatile memory means in an operable state in response to a signal from the external device, said second volatile memory means including full CMOS memory cells having a minimum data holding voltage lower than the minimum data holding voltage of said first volatile memory means, said signal transmission means transmitting data signals, address signals, and control signals between said second volatile memory means and the external device;
   an internal power source line including separate first and second internal power source lines for supplying power from the external device to said first and second volatile memory means, respectively, said primary cell backing up said memory card being connected to both of said first and second internal power source lines;
   auxiliary back up means connected to said second internal power source line for extending data holding time of said second volatile memory means;
   a primary cell connected to said internal power source line for supplying a data holding voltage to said first and second volatile memory means to back up said first and second memory means when no power is supplied from said external device.

9. The memory card according to claim 8 wherein said auxiliary back up means comprises a capacitor having a large capacity.

10. The memory card according to claim 8 wherein said auxiliary back up means comprises a secondary cell.

* * * * *